United States Patent [19]
Pierrat et al.

[11] Patent Number: 6,162,568
[45] Date of Patent: Dec. 19, 2000

[54] PROCESS FOR FORMING FEATURES ON A SEMICONDUCTOR WAFER USING A PHASE SHIFTING MASK THAT CAN BE USED WITH TWO DIFFERENT WAVELENGTHS OF LIGHT

[75] Inventors: Christophe Pierrat; J. Brett Rolfson, both of Boise, Id.

[73] Assignee: Micron Technology, Inc., Boise, Id.

[21] Appl. No.: 09/550,765

[22] Filed: Apr. 17, 2000

Related U.S. Application Data

[63] Continuation of application No. 09/229,616, Jan. 13, 1999, Pat. No. 6,068,951, which is a continuation of application No. 08/679,835, Jul. 15, 1996, Pat. No. 5,876,878.

[51] Int. Cl.$^7$ ...................................................... G03F 9/00
[52] U.S. Cl. ................................................................. 430/5
[58] Field of Search ............................... 430/5, 322, 323, 430/324; 378/35

[56] References Cited

U.S. PATENT DOCUMENTS

| | | | |
|---|---|---|---|
| 5,308,722 | 5/1994 | Nistler | 430/5 |
| 5,397,664 | 3/1995 | Noelscher et al. | 430/5 |
| 5,457,006 | 10/1995 | Hirokane et al. | 430/324 |
| 5,549,995 | 8/1996 | Tanaka et al. | 430/5 |
| 5,670,281 | 9/1997 | Dai | 430/5 |

FOREIGN PATENT DOCUMENTS

| | | | |
|---|---|---|---|
| 2-140743 | 5/1990 | Japan | G03F 1/08 |

*Primary Examiner*—S. Rosasco
*Attorney, Agent, or Firm*—Howrey Simon Arnold & White, LLP

[57] ABSTRACT

A phase shifting mask can be used to form features on a semiconductor wafer with exposure lights of two different wavelengths. The depth of the phase shifting layer is calculated and fabricated such that it shifts a first exposure light about 180° and a second exposure light about 180°.

16 Claims, 1 Drawing Sheet

PROCESS FOR FORMING FEATURES ON A SEMICONDUCTOR WAFER USING A PHASE SHIFTING MASK THAT CAN BE USED WITH TWO DIFFERENT WAVELENGTHS OF LIGHT

This is a continuation of application Ser. No. 09/229,616 filed Jan. 13, 1999 U.S. Pat. No. 6,068,951, which was a continuation of application Ser. No. 08/679,835 filed Jul. 15, 1996 U.S. Pat. No. 5,876,878.

This invention was made with government support under Contract No. MDA 972-92-C-0054 awarded by Advanced Research Projects Agency (ARPA). The government has certain rights in this invention.

BACKGROUND OF THE INVENTION

The present invention relates to processes for creating photomasks or reticles used in the fabrication of semiconductor devices. More particularly, the present invention relates to phase shifting photomasks and processes for designing them.

Advances in capacity in semiconductor chips have generally been the result of decreases in the size of the features on the chip. The lateral dimensions of features are generally defined by photolithographic techniques in which a detailed pattern is transferred to a photoresist by shining light through a mask or reticle.

In recent years, phase shifting masks have been developed to improve photolithographic processes. Phase shifting masks increase image contrast and resolution without reducing wave length or increasing numerical aperture. These masks also improve depth of focus and process latitude for a given feature size.

With phase shift photolithography, the interference of light rays is used to overcome the problems of diffraction and improve the resolution and depth of optical images projected onto a target. With this technology, the phase of the exposure light at the target is controlled such that adjacent bright areas are preferably formed 180° out of phase with each other. Dark regions are thus produced between the bright areas by destructive interference even when diffraction would otherwise cause these areas to be lit. This technique improves total resolution at the target.

In general, a phase shifting mask is constructed with a repetitive pattern formed of three distinct layers. An opaque layer provides areas that allow no light transmission. A first transparent layer provides areas which allow close to 100% of the light to pass through. A transparent phase shifting layer provides areas which allow close to 100% of the light to pass through but phase shifted 180 degrees from the light passing through the first transparent layer. The first transparent layer and the phase shifting layer are positioned such that light rays diffracted through each area are cancelled out in a darkened area between them. This creates a pattern of dark and bright areas which can be used to clearly delineate features of a pattern defined by the opaque layer on the semiconductor wafer. Another method of constructing a phase shifting mask utilizes a semitransparent layer to cause the phase shift.

One process for fabricating phase shifting masks includes forming an opaque layer on a major surface of a transparent substrate, patterning the opaque layer to expose portions of the underlying transparent substrate, forming a phase shifting mask layer to expose the portions of the underlying transparent substrate, phase-etching the exposed portions of the transparent substrate until a 180° phase shift is accomplished. Other processes of fabricating phase shifting masks include those in which a transparent film is formed over a portion of a mask to create a phase shift as well as the etching of phase shifting channels into the mask substrate.

Phase shifting masks are considerably more difficult to design and fabricate than conventional photomasks. Accordingly, it is desirable to fabricate phase shifting masks which will have as long a useful life as possible and which are capable of being used under varying exposure conditions. One of the problems associated with current phase shifting masks is that they must be designed for use with a specific type of stepper.

Accordingly, it would be a significant advancement in the art to provide a photomask and method of fabrication wherein the photomask could be used with different types of steppers. It would be further advancement if such a photomask could be used with steppers having different wave lengths.

BRIEF SUMMARY OF THE INVENTION

The present invention provides a phase shifting photomask that can be used with steppers having different wave lengths of exposure light. The present invention also provides a method for designing such a phase shifting photomask.

In a preferred embodiment of the present invention, a phase shifting mask layout is designed and etched using conventional techniques. The depth of the etch for the phase shifting portion is calculated and etched such that exposure light of two different wavelengths will each have a phase shift of about 180°.

DETAILED DESCRIPTION OF THE PREFERRED EMBODIMENTS

Figure 1:
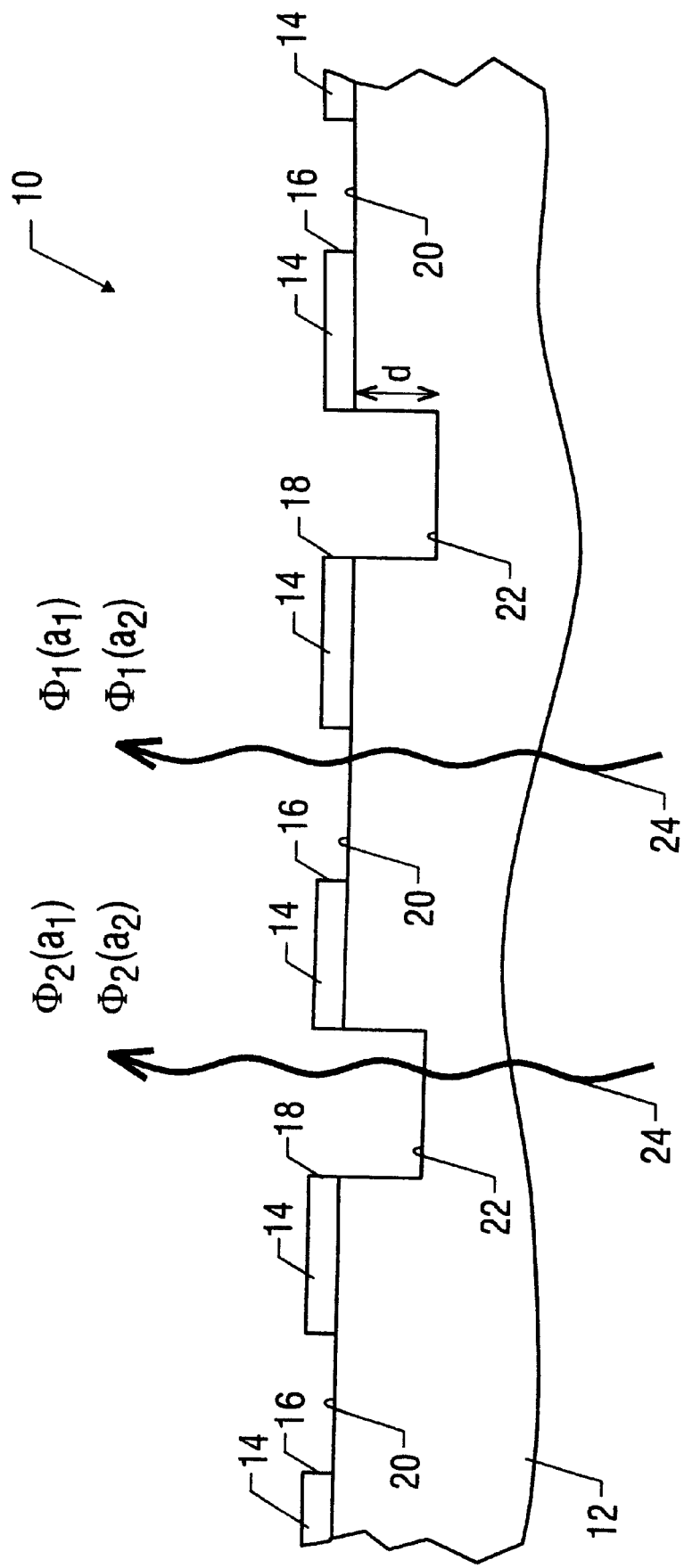
FIG. 1 is a schematic cross-sectional view of a portion of a phase shifting mask according to the present invention.

The present invention provides a phase shifting photomask which can be used with different wave lengths of light. The invention is best understood by reference to the attached drawing in connection with the following description.

Referring first to FIG. 1, a portion of a phase shifting mask 10 is illustrated in cross-section. Mask 10 includes a quartz substrate 12 with a chrome layer 14 formed thereon. A plurality of apertures 16 and 18 are formed in chrome layer 14. Apertures 16 expose the surface of quartz substrate 12. Apertures 18 expose portions of quartz substrate 12 which have been etched to a depth d to create a phase shifting layer 22. Mask 10 is designed and fabricated using tools and techniques well known to those skilled in the art of mask design.

Mask 10 is designed such that light having a wave length of either $\lambda_1$ or $\lambda_2$ can be used. As the light passes through apertures 16 it has a phase of $\phi_1$. As the light passes through apertures 18, both wave lengths $\lambda_1$ and $\lambda_2$ have a phase of $\phi_2$. The depth d of the etch in the quartz is such that $$\phi_2(\lambda_2) - \phi_1(\lambda_2) = \pi(\pm 2k\pi) \quad (1)$$

$$\phi_2(\lambda_1) - \phi_1(\lambda_1) = \pi(\pm 2k\pi) \quad (2)$$

wherein $\lambda$ equals the wave length of the light and $\phi$ equals phase of the light and k is an integer. Mask 10 will behave like an alternating aperture phase shifting mask for both $\lambda_1$ and $\lambda_2$ wave lengths.

In order to design a phase shifting mask whereby a 180° phase shift is obtained at a first wave length and a 180° phase shift is obtained at a second wave length, it is necessary to find a common depth for the phase shifting layer 22 which will produce the desired phase shifts. This can be accomplished by using the formula $$d = \frac{i\lambda}{2(n-1)} \quad (5)$$

wherein d equals depth of the etch, i equals an odd number for a 180° phase shift and an even number for a 0° phase shift, λ equals the wave length of exposure light and n equals the refractive index of the material the light travels through. Setting d to be approximately equal for two different wave lengths results in the following equation $$\frac{i_1\lambda_1}{2(n_1-1)} \approx \frac{i_2\lambda_2}{2(n_2-1)} \quad (6)$$

since $\lambda_1$, $\lambda_2$, $n_1$ and $n_2$ are known quantities, $i_2$ can be expressed as a function of $i_1$ $$i_2 \approx \frac{i_1\lambda_1}{(n_1-1)} \cdot \frac{(n_2-1)}{\lambda_2} \quad (7)$$

This equation can be solved for various wave lengths and substrate materials. For example, for an i-line process with a quartz substrate, an etch depth of 3850 Å produces a shift of 180° such that $n_{365}$ equals 1.474. For a deep UV process at 248 nm, a 2440 Å quartz etch shifts the light 180° resulting in $n_{248}$ equals 1.508. Substituting these values into equation 5, results in $$i_2 \approx i_1(1.5773) \quad (8)$$

A table can be created to help determine an appropriate value for $i_1$ and $i_2$. Using the values from equation 8 results in the following table:

| $i_1$ | $i_2$ |
|---|---|
| 1 | 1.5773 |
| 3 | 4.7319 |
| 5 | 7.8865 |
| 7 | 11.0411 |
| 9 | 14.1957 |
| 11 | 17.3503 |

From this table it is apparent that at $i_1$ equals 7, $i_2$ is approximately equal to an odd integer, in this case 11.

Using a value of 7 for $i_1$, it is possible to calculate a depth for the phase shifting layer which will produce a 180° phase shift for $\lambda_1$ and an approximately 180° phase shift for $\lambda_2$. Using a value of $i_2$ equals 11 it is possible to obtain a depth which will produce a 180° phase shift for $\lambda_2$ and an approximately 180° phase shift for $\lambda_1$. In order to obtain a mask which works equally well at both wave lengths, the difference in the depths could be averaged. For $i_1$ equals 7, d equals 26950 Å. For $i_2$ equals 11, d equals 26840 Å. Since a phase change at 248 nm requires 0.634 as much depth as an equal phase change at 365 nm the compromise depth can be calculated as follows:

$$26950+(0.634)(26850-26950)=26887 \text{ Å} \quad (7)$$

Thus, a quartz mask having a phase shifting layer about 26890 Å deep can be used with an i-line exposure at 365 nm and a deep UV exposure at 248 nm. It will be appreciated by those skilled in the art that similar calculations can be performed to design a mask fabricated from other substrate materials or a mask to be used with different exposure lights. Additional substrate materials that have been used for photomasks include borosilicate glass and soda-lime glass. Other exposure lights include g-line at 436 nm and h-line at 405 nm.

While the invention has been described with respect to the presently preferred embodiments, it will be appreciated by those skilled in the art that modifications and changes can be made to the present invention without departing from its spirit or essential characteristics. For example, this process can be used with additive phase shifting masks as well as subtractive phase shifting masks. Accordingly, all modifications or changes which come within the meaning and range of equivalency of the claims are to be embraced within their scope.

What is claimed is:

1. A method of forming features on a semiconductor wafer comprising, projecting an optical image through a phase shifting mask onto a semiconductor wafer, said mask including a phase shifting layer which shifts a first exposure light having a first wavelength about 180° and which shifts a second exposure light having a second wavelength about 180°.

2. The method of claim 1 wherein said first exposure light has a wavelength of about 365 nm.

3. The method of claim 1 wherein said second exposure light has a wavelength of about 248 nm.

4. The method of claim 1 wherein said first exposure light has a wavelength of about 365 nm and second exposure light has a wavelength of about 248 nm.

5. The method of claim 1 wherein said mask comprises a quartz substrate.

6. The method of claim 1 wherein said phase shifting layer is etched into the mask surface.

7. The method of claim 6 wherein said phase shifting layer has a depth of about 26890 Å.

8. The method of claim 1 wherein said phase shifting layer is added to said mask surface.

9. The method of claim 8 wherein said phase shifting layer has a thickness of about 26890 Å.

10. The method of claim 1 wherein said phase shifting mask comprises a quartz substrate, said first exposure light has a wavelength of about 365 nm, said second exposure light has a wavelength of about 248 nm and said phase shifting layer has a depth of about 26890 Å.

11. A method of forming features on a semiconductor wafer comprising, projecting an optical image through a phase shifting mask onto a semiconductor wafer, said mask formed from a quartz substrate having a surface including a phase shifting layer which shifts a first exposure light having a wavelength of about 365 nm about 180° and which shifts a second exposure light having a wavelength of about 248 nm about 180°.

12. The method of claim 11 wherein said phase shifting layer is etched into said surface.

13. The method of claim 11 wherein said phase shifting layer is added to said surface.

14. A method of forming features on a semiconductor wafer comprising, projecting an optical image through a phase shifting mask onto a semiconductor wafer, said mask including a phase shifting layer having a depth shifting a first exposure light having a first wavelength and a second exposure light having a second wavelength approximately the same amount.

15. The method of claim 14 wherein the first wavelength is about 365 nm and the second wavelength is about 248 nm.

16. The method of claim 14 wherein the depth of the phase shifting layer is about 26890 Å.

* * * * *